(12) United States Patent
Vobecky et al.

(10) Patent No.: US 12,464,749 B2
(45) Date of Patent: Nov. 4, 2025

(54) POWER SEMICONDUCTOR DEVICE

(71) Applicant: Hitachi Energy Ltd, Zürich (CH)

(72) Inventors: Jan Vobecky, Lenzburg (CH);
Umamaheswara Vemulapati, Windisch (CH)

(73) Assignee: HITACHI ENERGY LTD, Zürich (CH)

( * ) Notice: Subject to any disclaimer, the term of this patent is extended or adjusted under 35 U.S.C. 154(b) by 439 days.

(21) Appl. No.: 18/023,982

(22) PCT Filed: Aug. 19, 2021

(86) PCT No.: PCT/EP2021/073039
§ 371 (c)(1),
(2) Date: Feb. 28, 2023

(87) PCT Pub. No.: WO2022/048919
PCT Pub. Date: Mar. 10, 2022

(65) Prior Publication Data
US 2023/0317818 A1    Oct. 5, 2023

(30) Foreign Application Priority Data

Sep. 3, 2020  (EP) .................................... 20194292

(51) Int. Cl.
*H10D 18/00*    (2025.01)
*H10D 18/01*    (2025.01)
(Continued)

(52) U.S. Cl.
CPC ............. *H10D 18/01* (2025.01); *H10D 18/00* (2025.01); *H10D 62/126* (2025.01);
(Continued)

(58) Field of Classification Search
CPC ...... H10D 18/01; H10D 18/00; H10D 62/126; H10D 62/148; H10D 64/233; H10D 64/291; H01L 23/4824
(Continued)

(56) References Cited

U.S. PATENT DOCUMENTS 3,619,738 A    11/1971  Otsuka
4,581,626 A     4/1986  Krishna et al.
(Continued)

FOREIGN PATENT DOCUMENTS

DE    3723150 A1    1/1988
EP    2463913 A1    6/2012
(Continued)

OTHER PUBLICATIONS

Radvan, "Fast thyristors. When burning for induction heating solutions", published by Power Electronics Europe, Aug. 2014, 6 pages.

*Primary Examiner* — Sheikh Maruf
(74) *Attorney, Agent, or Firm* — Procopio, Cory, Hargreaves & Savitch LLP

(57) ABSTRACT

Disclosed is a power semiconductor device comprising a semiconductor wafer having a first main side and second main side. The semiconductor wafer comprises parallel thyristor cells, which each comprises (a) a cathode electrode and gate electrode on the first main side; (b) a cathode layer comprising a cathode region of a first conductivity type, forming an ohmic contact with the cathode electrode; (c) a first base layer of a second conductivity type, wherein the cathode region forms a p-n junction between the first base layer and cathode region; (d) a second base layer of the first conductivity type forming a second p-n junction with the first base layer; (e) an anode layer of the second conductivity type separated from the first base layer by the second base layer. The gate electrodes of the plurality of thyristor cells
(Continued)

form a gate design comprising multiple polygons each comprising at least four struts.

20 Claims, 5 Drawing Sheets

(51) Int. Cl.
  *H10D 62/10* (2025.01)
  *H10D 62/13* (2025.01)
  *H10D 64/23* (2025.01)
  *H10D 64/27* (2025.01)
(52) U.S. Cl.
  CPC ......... *H10D 62/148* (2025.01); *H10D 64/233* (2025.01); *H10D 64/291* (2025.01)
(58) Field of Classification Search
  USPC ........................................................ 257/107
  See application file for complete search history.

(56) References Cited

U.S. PATENT DOCUMENTS

| | | | | |
|---|---|---|---|---|
| 5,021,855 A | * | 6/1991 | Oikawa | ................ H10D 62/206 |
| | | | | 257/152 |
| 5,032,887 A | * | 7/1991 | Oliveri | ................ H10D 64/231 |
| | | | | 257/E29.174 |
| 6,258,634 B1 | * | 7/2001 | Wang | ........................ H10D 8/80 |
| | | | | 257/E29.337 |
| 7,327,541 B1 | * | 2/2008 | Wang | ........................ H10D 8/80 |
| | | | | 257/355 |
| 9,741,839 B1 | | 8/2017 | Nakagawa | |
| 2002/0175383 A1 | * | 11/2002 | Kocon | ................. H10D 62/393 |
| | | | | 257/376 |
| 2002/0195653 A1 | * | 12/2002 | Huang | ................. H10D 12/461 |
| | | | | 257/E29.115 |
| 2016/0303048 A1 | * | 10/2016 | Libanati | ............. A61K 31/4985 |
| 2018/0204913 A1 | * | 7/2018 | Arnold | ................. H10D 62/148 |
| 2018/0330772 A1 | * | 11/2018 | Guo | ........................ G11C 11/39 |
| 2020/0203516 A1 | * | 6/2020 | Menard | ................ H10D 64/291 |
| 2020/0258981 A1 | * | 8/2020 | Guitard | ................. H10D 18/01 |
| 2021/0036136 A1 | * | 2/2021 | Schenk | ................. H10D 62/148 |
| 2022/0108741 A1 | * | 4/2022 | Hong | ...................... H10D 18/40 |

FOREIGN PATENT DOCUMENTS

| | | |
|---|---|---|
| EP | 3073530 B1 | 5/2017 |
| JP | S4614338 Y1 | 5/1971 |
| JP | 62-195174 A | 8/1987 |
| JP | S6319871 A | 1/1988 |
| JP | S6399568 A | 4/1988 |
| JP | H0864804 A | 3/1996 |
| JP | 2017526175 A | 9/2017 |
| JP | 2018519660 A | 7/2018 |
| WO | 2016/193078 A1 | 12/2016 |

* cited by examiner

POWER SEMICONDUCTOR DEVICE

CROSS-REFERENCE TO RELATED APPLICATIONS

The present application is a national stage entry of International Patent Application No. PCT/EP2021/073039, filed on Aug. 19, 2021, which claims priority to European Patent Application No. 20194292.7, filed on Sep. 3, 2020, which are both hereby incorporated herein by reference as if set forth in full.

TECHNICAL FIELD

The present disclosure relates to a power semiconductor device comprising among others a plurality of parallel thyristor cells, wherein the gate electrodes of the plurality of thyristor cells form a gate design comprising multiple polygons each comprising at least four struts and a method of manufacturing such a power semiconductor device.

Examples for the application of such power semiconductor devices are e.g. induction heating, crowbar protection, high-voltage-direct current (HVDC) electric power transmission, Flexible Alternating Current Transmission Systems (FACTS), etc.

TECHNICAL BACKGROUND

Four region semiconductor switching devices known as thyristors (npnp or pnpn) have previously been constructed with locally shorted cathode emitters forming a uniform shorting pattern (typically triangular or hexagonal) placed at a large continuous cathode area. For the purpose of fast turn-off by a gate electrode, the cathode regions are segmented into a narrow stripes to facilitate fast charge removal by the commutation of the gate-cathode junction (Gate Commutated Thyristor GCT). The described embodiments focus on the improved turn-on capability in terms of ruggedness and robustness while maintaining the commutation capability by an external circuit as is typical for the Phase Controlled Thyristors (PCT) dedicated to 50 and 60 Hz operation frequency and fast thyristors capable of kHz operation frequencies. The latest applications of both the PCT and fast thyristors are attributed by the need of fast and rugged turn-on.

For the purpose of a fast turn-on using the gate electrode and fast turn-off by circuit commutation without using the gate electrode, the thyristors are provided by the gate electrode uniformly distributed over the cathode area in a way to maximize the gate-cathode boundary at the cathode surface. The benefit of this provision is a lower circuit commutation time tq and higher dV/dt capability, i.e. the capability of blocking fast voltage transient in the forward regime without triggering. Depending on the specific design, one can also reach a high dI/dt capability, i.e. the capability to safely turn on fast transients of anode current. As the dV/dt and dI/dt capability are subject to a trade-off, the maximal ratings of these two parameters cannot be reached simultaneously.

It is known to construct a thyristor with a semiconducting body having at least one external emitter zone and an adjacent base zone which is electrically connected with an emitter electrode associated with the emitter zone via a plurality of shorts (short areas where an electric short circuit can appear) located in the emitter zone of the cathode. Beside the reduction of the leakage current, the purpose of the emitter shorts is to improve the dV/dt capability. The improvement in the dV/dt behavior occurs since part of the electrons is shorted to the emitter zone, on the application of a voltage to the thyristor, flow directly to the emitter electrode via the shorts without giving rise to an emission of charge carriers from the emitter zone. On firing, or triggering, with an applied voltage, an emission of charge carriers from the emitter zone sets in at higher dV/dt values in the case of thyristors with a shorted emitter area, than in thyristors with a small shorted emitter area or more distant shorts. At the same time, there is an increase in the value of the thyristor current at which the thyristor is switched into to the conducting state without a fed-in control current. In order to improve the dV/dt behavior, the distance of shorts may be reduced (shorted area is increased), for example, by increasing the diameter of the shorts or by increasing the amount of a relatively small shorts. However, the shorts cause a hindrance for the propagation of the firing process emanating from the emitted edge adjacent to the control electrode and reduce the dI/dt capability. As a result, the spread of the firing process is strongly restraint by reducing the mutual distance of shorts.

State of the art thyristors do not satisfy the increased demands on high dI/dt and high dV/dT capability and low turn-off time $t_q$ as required in many recent applications. The dI/dt capability is limited to several hundred A/µs. Fast thyristors usually provide an increased dI/dt capability and a lower turn-off time $t_q$ but their designs sacrifice the dV/dt capability and ON-state losses. A classical design strategy for high dI/dt capability and low turn-off time $t_q$ is based on extending the boundary between the gate and cathode. In this case, a simple gate electrode of a classical thyristor is extended using a distributed amplifying gate structure to uniformly cover most of the whole cathode area. The distributed amplifying gate (AG) concept is used to speed-up the turn-ON process. During turn-ON, the electron-hole plasma of already turned-ON region is moving laterally from the AG into the inner cathode regions. The cathode comprises uniformly distributed shorts (local shorting of gate-cathode junction) to provide the required dV/dt capability, see e.g. WO 2016/193078 A1. The better the dV/dt, the lower is the dI/dt capability.

U.S. Pat. No. 9,741,839 B1 e.g. discloses a thyristor device including a disk-shaped device comprising semiconductor material forming alternating p-n-p-n-type layers. The device may include a gate area extending from an external gate lead contact point to a plurality of thyristor units connected in parallel. Each thyristor unit may include at least one exposed p-base (pB) layer portion to form at least one plural point to which gate current may be directed. Further, an insulator layer may be formed over the gate area to insulate at least a portion of the gate electrode from the pB layer so that displacement current may be directed to short dots and then to the plural points. Current entering each thyristor unit may generate a turned-ON area at each thyristor unit that spreads throughout the thyristor device. This concept however requires a complex manufacturing process and may not be suitable for large area devices, because of a limited amount of thyristors acting in parallel during turn-ON. An increased amount of the parallel operating thyristors might be possible in this concept, however at the penalty of the cathode area consumed by the gate extensions. This would lead to a higher ON-state voltage (losses), which is already high enough in the fast thyristors for the purpose of strongly reduced excess carrier lifetime to satisfy the demands on a very low turn-off time tq.

U.S. Pat. No. 4,581,626 A discloses a gate turn-off thyristor, wherein a gate design comprises multiple polygons each comprising at least four struts. U.S. Pat. No. 3,619,738 A discloses a thyristor with a gate grid distribution over the cathode surface to improve turn-on. DE 37 23 150 A1 discloses a gate turn-off thyristor structure with a segmented cathode surface. JP S62 195174 A discloses a semiconductor structure with a segmented cathode side and a central gate region. The cathode segments are surrounded by a gate structure building a mesh of hexagonal forms. EP 2 463 913 A1 discloses a method of forming a thyristor using implantation of cathode regions and cathode-short regions as well as a step of forming a gate contact.

SUMMARY

It is therefore an object of embodiments to provide a power semiconductor device with high dI/dt and dV/dt capability and low turn-off time $t_q$ and at the same time to provide both, forward and reverse blocking capability and the capability to very quickly turn-off. This is achieved by maximizing the length of the gate-cathode boundary in a way that relatively small cathode islands of a polygonal shape are homogenously distributed over a semiconductor wafer and completely surrounded by the gate metallization. Because of no demands on the gate turn-off capability typical for the GCTs (only circuit commutation is in play in our case), the size of the cathode islands may be much higher than in the GCT hereby providing a space for an effective placement of cathode short areas. At the same time, the size of the cathode islands may be much lower than the cathode areas between the gate or amplifying gates of the classical thyristors hereby bringing much faster turn-off and much higher dI/dt. The new concept of cathode dimensioning allows us to subordinate the size of the cathode islands to the optimal size and placement of cathode short areas for the maximal dI/dt and dV/dt and the lowest tq at the same time.

The achievement of the maximal dV/dt capability in the classical thyristors requires the placement of closely packed cathode short areas as close to the gate runners (edges of the P-type gate region) as possible. However, this provision substantially reduces the size of the conducting area at the early stage of the turn-off, which is located between the edge of the gate region and the closest cathode short areas, and reduces the dI/dt capability. A multifold increase of the length of the gate-cathode periphery, while keeping the optimal position of cathode short areas from the viewpoint of the dV/dt capability, may provide an enlargement of the conducting area at the early stage of the turn-off and increase the dI/dt capability. The fact that hundreds of parallel connected thyristors (cathode areas) may turn-on at the same time eliminates the drawback of the classical thyristors, namely the necessity of lateral plasma spreading from the central or amplifying gate towards the wafer edge to completely turn-on the large area cathode region, leads to a significant increase of the dI/dt capability. The possibility to use the cathode short areas to optimize the dV/dt capability within the internal device structure, i.e. without a need of an external control by the gate circuit like in the GCT type devices brings to this concept dynamic robustness without any additional demands on the gate control.

An object of embodiments is attained by a power semiconductor device according to claim 1 and a method of manufacturing the power semiconductor device according to claim 18.

A power semiconductor device according to an embodiment comprises a semiconductor wafer having a first main side and a second main side opposite to the first main side, the semiconductor wafer comprising a plurality of parallel thyristor cells, wherein each thyristor cell comprises in an order from the first main side to the second main side: (a) a cathode electrode and a gate electrode arranged on the first main side; (b) a cathode layer comprising a cathode region of a first conductivity type, forming an ohmic contact with the cathode electrode; (c) a first base layer of a second conductivity type different from the first conductivity type, wherein the cathode region is formed as a well in the first base layer and forms a first p-n junction between the first base layer and the cathode region; (d) a second base layer of the first conductivity type forming a second p-n junction with the first base layer; and (e) an anode layer of the second conductivity type separated from the first base layer by the second base layer, wherein the gate electrode forms an ohmic contact with the first base layer; and an anode electrode is arranged on the second main side and forms an ohmic contact with the anode layer. The gate electrodes of the plurality of thyristor cells form a gate design comprising multiple polygons each comprising at least four struts.

In another embodiment, the multiple polygons are connected via a central gate contact.

In another embodiment, the multiple polygons are connected via a peripheral gate contact.

In another embodiment, a lateral width of the struts is in a range of 0.1 mm to 1 mm or in a range of 0.1 mm to 0.5 mm.

In another embodiment, a lateral width of the struts of the polygons decreases with growing distance from the central or peripheral gate contact.

In another embodiment, the power semiconductor device is a high-power reverse blocking thyristor or a reverse conducting thyristor.

In another embodiment, the cathode regions are of hexagonal shape and the cathode layers comprise cathode short areas of the second conductivity type connecting the cathode electrodes with the first base layers.

In another embodiment, the cathode short regions are of polygonal shape or circular shape or stripe shape and the cathode short areas are placed along a hexagonal gate-cathode boundary within the hexagonal cathode region.

In another embodiment, the Power semiconductor device comprises first cathode metal layers contacting the cathode regions and second cathode metal layers contacting the first cathode metal layers of all of the cathode regions of the plurality of thyristor cells.

In another embodiment, the Power semiconductor device comprises gate-cathode insulations laterally between the gate electrodes and the first cathode metal layers on the first main side of the wafer.

In another embodiment, the Power semiconductor device comprises gate insulations on the gate electrodes and on the gate-cathode insulations.

In another embodiment, the first cathode metal comprises aluminum and the second metal layer is formed by a disk, e.g. made of molybdenum, which contacts all individual cathode segments into a single cathode electrode or the second metal layer comprises aluminum, which contacts all individual cathode segments into a single cathode electrode.

In another embodiment, the first cathode metal layers form a substance-to-substance bond to the cathode regions and the second cathode metal layers form a removable connection to the first cathode metal layers which second cathode metal layers contact the first cathode metal layers of all thyristor cells as one single common disk.

In another embodiment, the cathode regions comprise top sections vertically extending above a top surface of the first base layer, which is the surface of the first base layer on the first main side, and bottom sections within the wafer, which are in contact to the second base layer 6.

In another embodiment, the cathode regions are one of a hexagonal shape, a stripe shape or a circular shape and an area of the top section is smaller than an area of the bottom section.

In another embodiment, the Power semiconductor device comprises gate-cathode insulations laterally between the gate electrodes and the top sections of the cathode regions and on top of the gate electrodes and cathode electrodes on top of the gate-cathode insulations and the top sections of the cathode regions contacting the top sections of the cathode regions.

In another embodiment, the plurality of thyristor cells form a honeycombed gate design comprising multiple hexagons each comprising six struts.

In another embodiment, the diameter of each of the hexagons is in a range of 1 mm to 20 mm or in a range of 2 mm to 10 mm.

The method of manufacturing a Power semiconductor device according to an embodiment comprises a step of providing the wafer having a first main side, a step of generating cathode regions within a cathode layer in the first base layer by diffusing a dopant pre-deposited at the first main side or implanting into the first main side; a step of generating cathode short areas in the cathode layer by diffusing a dopant pre-deposited at the first main side or implanting into the first main side; a step of forming ohmic contacts of the gate electrodes through a structured metal mask; a step of forming gate-cathode insulations through a structured mask layer, wherein this mask layer is etched on the cathode regions; a step of forming ohmic contacts of the cathode electrodes with the cathode regions.

BRIEF DESCRIPTION OF THE DRAWINGS

The subject matter of embodiments will be explained in more detail in the following detailed description with reference to the attached drawings in which.

The reference signs used in the Figures are summarized in the List of Reference Signs at the end of this specification. The described embodiments are meant as examples and shall not confine the invention. The invention is solely defined by the claims.

DETAILED DESCRIPTION OF EMBODIMENTS AND EXAMPLES

Embodiments will now be explained in detail on the basis of several examples in association with appended drawings 1 to 5.

Figure 1:
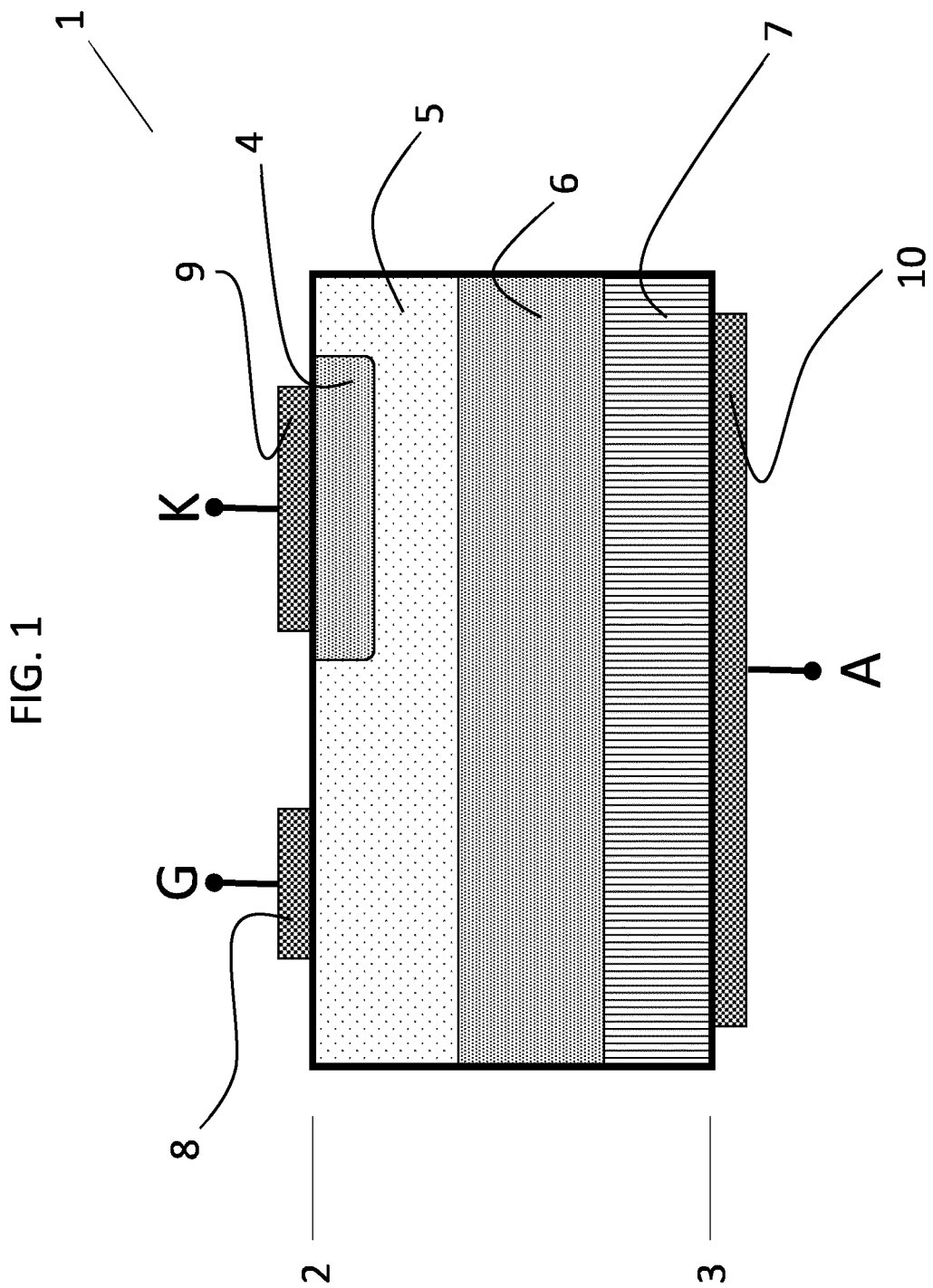
FIG. 1 shows an example of the basic structure of a power semiconductor device, exemplarily a thyristor.

FIG. 1 shows an example of a power semiconductor device 1, exemplarily a phase controlled thyristor with a four-layer structure (pnpn or npnp). The power semiconductor device 1 comprises a semiconductor wafer having a top surface on a first main side 2 and a bottom surface on a second main side 3 opposite to the first main side 2. The power semiconductor device 1 comprises a plurality of parallel thyristor cells, wherein each thyristor cell comprises in a sequential order from the first main side 2 to the second main side 3 a cathode electrode 9 and a gate electrode 8 arranged on the first main side 2, a cathode layer comprising a cathode region 4 of a first conductivity type and forming an ohmic contact with the cathode electrode 9, e.g. $n^+$-type, a first base layer 5 of a second conductivity type, e.g. p-type, different from the first conductivity type, wherein the cathode region 4 is formed as a well in the first base layer 5 to form a first p-n-junction between the first base layer 5 and the cathode region 4, a second base layer 6 of the first conductivity type, e.g. $n^-$-type, forming a second pn-junction with the first base layer 5, and an anode layer 7 of the second conductivity type, e.g. $p^+$-type, separated from the first base layer 5 by the second base layer 6, wherein the gate electrode 8 forms an ohmic contact with the first base layer 5 and an anode electrode 10 is arranged on the second main side 3 and forms an ohmic contact with the anode layer 7.

Figure 2A:
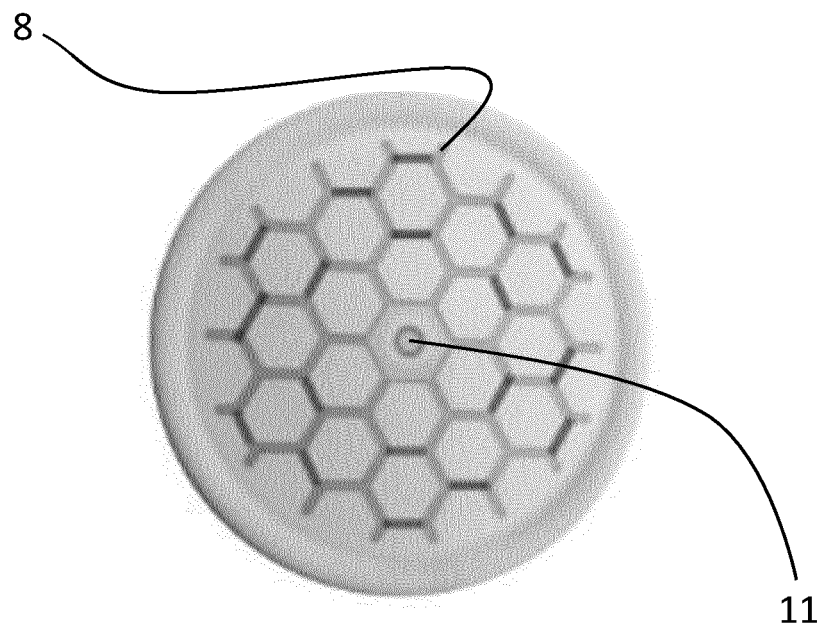
FIG. 2A, 2B disclose examples for a gate design of a power semiconductor device according to an embodiment.
Figure 2B:
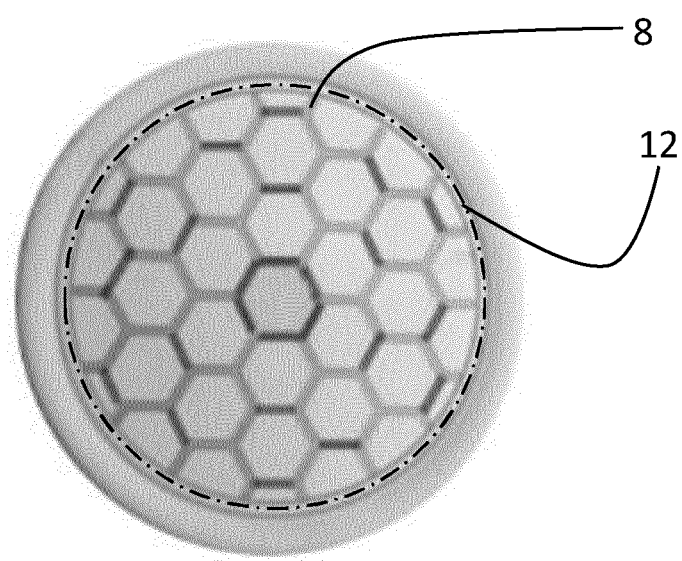

To maximize the dI/dt and dV/dt capability and at the same time to lower the commutation turn-off time $t_q$, the power semiconductor device 1 according to an embodiment requires a design of the gate electrodes 8 of the plurality of thyristor cells formed by multiple polygons each comprising at least four (4) struts as shown e.g. in FIGS. 2A and 2B. Due to the closed cell structure by multiple polygons, thyristor segments are created which are operating in parallel.

In another embodiment, as shown e.g. in FIG. 2A, the multiple polygons of the gate electrode are connected via a central gate contact 11.

In another embodiment, as shown e.g. in FIG. 2B, the gate contact 12 is moved to the periphery of the silicon wafer to turn-ON the thyristor starting from a longer gate-cathode boundary towards center to minimize the effect of stray inductance.

In another embodiment, a lateral width of the struts is in a range of 0.1 mm to 1 mm, exemplarily in a range of 0.1 mm to 0.5 mm to maximize the number of thyristor segments in parallel. The term lateral in this context refers to an inplane direction when viewed in plan view onto the top surface of the first main side 2.

In another embodiment, a lateral width of the struts decreases with growing distance from the central gate contacts 11 or peripheral gate contacts 12 to minimize the cathode area consumption (bringing a lower ON-state voltage VT) in the areas with decreasing amount of cathode polygons to be supplied by the gate current during turn-on.

According to specific embodiments, the power semiconductor device according to an embodiment is a high-power reverse blocking thyristor or a reverse conducting thyristor.

According to another embodiment, the cathode regions 4 are of hexagonal shape and the cathode layers comprise cathode short areas 13 of the second conductivity type connecting the cathode electrodes 9 with the first base layers 5 to improve the dV/dt behavior of the power semiconductor device by allowing a part of the electrons flowing directly to the emitter electrode via the cathode short areas without giving rise to an emission of charge carriers from the emitter zone.

According to another embodiment, the cathode short areas 13 are of polygonal shape or circular shape or stripe shape and the cathode short areas 13 are placed along a hexagonal gate cathode boundary within the hexagonal cathode regions 4. Some embodiments of shapes of the cathode short areas 13 are shown as examples in FIGS. 3A-3C. In this respect, FIG. 3A discloses a cathode short area 13 of hexagonal shape, which is a specific type of polygonal shape comprising six struts.

Figure 3A:
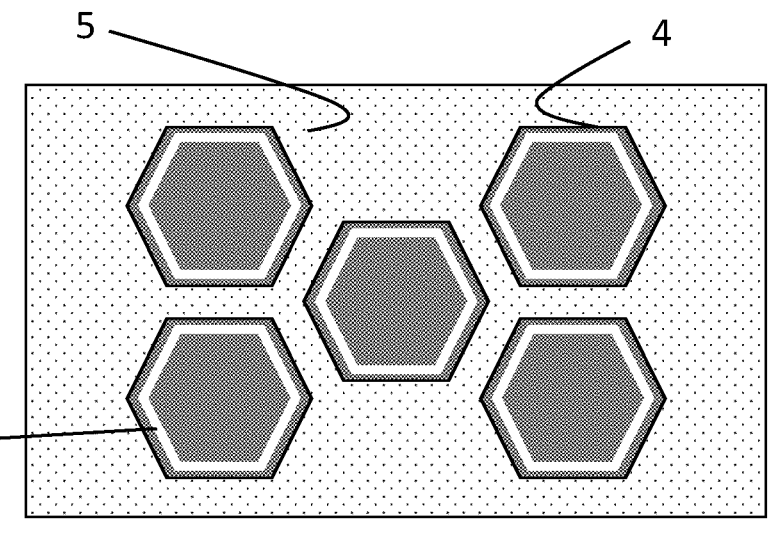
FIG. 3A, 3B, 3C show examples of shapes of cathode short areas.
Figure 3B:
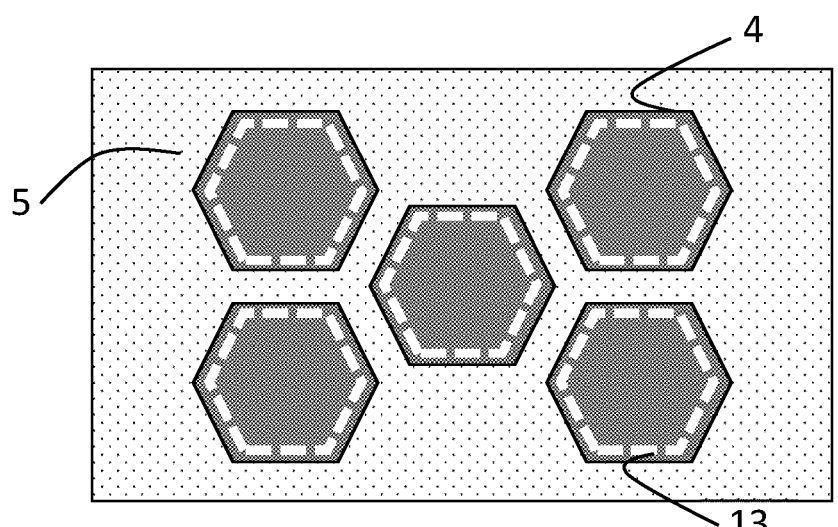
Figure 3C:
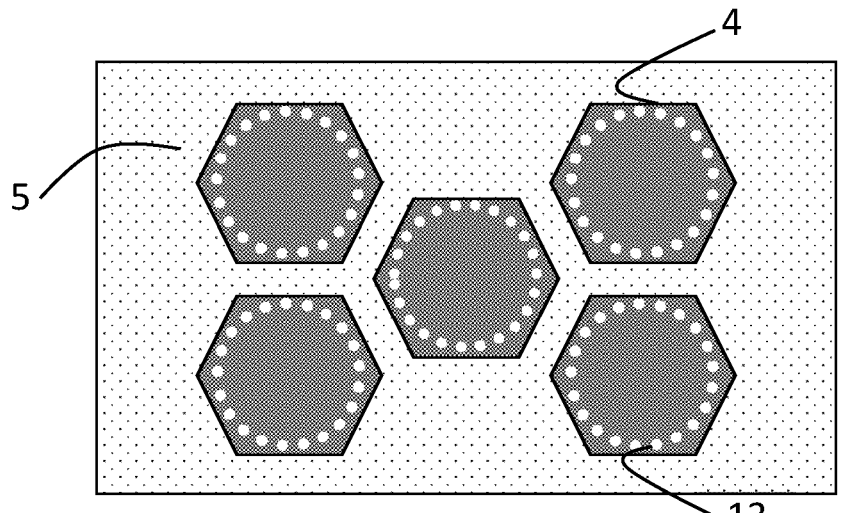

In another embodiment, as shown e.g. in FIG. 3C, the cathode short areas 13 are of circular shape and are placed along the hexagonal gate-cathode boundary within the hexagonal cathode region 4.

In another embodiment, as shown e.g. in FIG. 3B, the cathode short areas 13 are of stripe shape and are placed along the hexagonal gate-cathode boundary within the hexagonal cathode region 4. Eventually, the cathode short areas of stripe shape may be placed perpendicularly to the gate-cathode boundary (not shown in the Figures).

When the cathode short areas of polygonal shape, e.g. of hexagonal shape, are placed along the hexagonal gate-cathode boundary as shown e.g. in FIG. 3A, where the $p^+$-type cathode short region is located in the hexagonal cathode region, the distance $L_{NP}$ from the gate-cathode boundary is a design parameter to achieve the required dV/dt rating. When viewed in plan view on the first main side 2, the width $L_P$ of the cathode short is limited by the resolution of available photolithography process (minimal feature size) and the efficiency of the cathode short itself. A reasonable range of diameter is 80 µm to 150 µm. As it is evident e.g. from FIG. 3D, the width of the cathode hexagon $$L_N = 2 \times L_{NP} + 2 \times L_P + x,$$

where x may correspond to the inner diameter of the cathode short areas 13 and is in a range of a distance between the cathode short areas, e.g. 300 µm to 900 µm. This results e.g. in $L_N$=500 µm to 1300 µm. To compensate corner effects of a polygonal structure of the cathode short areas, the cathode short areas also may be of circular shape or stripe shape as shown in e.g. in FIGS. 3C and 3B. One difference from prior art designs is that the cathode regions are so small that there is no need for a shorting pattern of spatially positioned cathode short areas like for example the triangular or trapezoidal one known from prior art. There is only a single line or row of cathode short areas in order to minimize the area of the cathode segment in order to gain the maximal length of the gate-cathode boundary providing the maximal dI/dt capability. To maximize the dI/dt capability, the present embodiment provides several measures to maximize the number of cathode segments as e.g. reducing the size of the polygons or reducing the width of the gate metal. In an extreme case of a very small cathode area 4 there may be only a single cathode short in the center of the cathode area.

To improve the thermal performance of the device, the area between the gate electrode 8 and the cathode electrode 9 may be filled by polyimide or any other insulator which has a higher thermal conductivity than air.

Figure 3D:
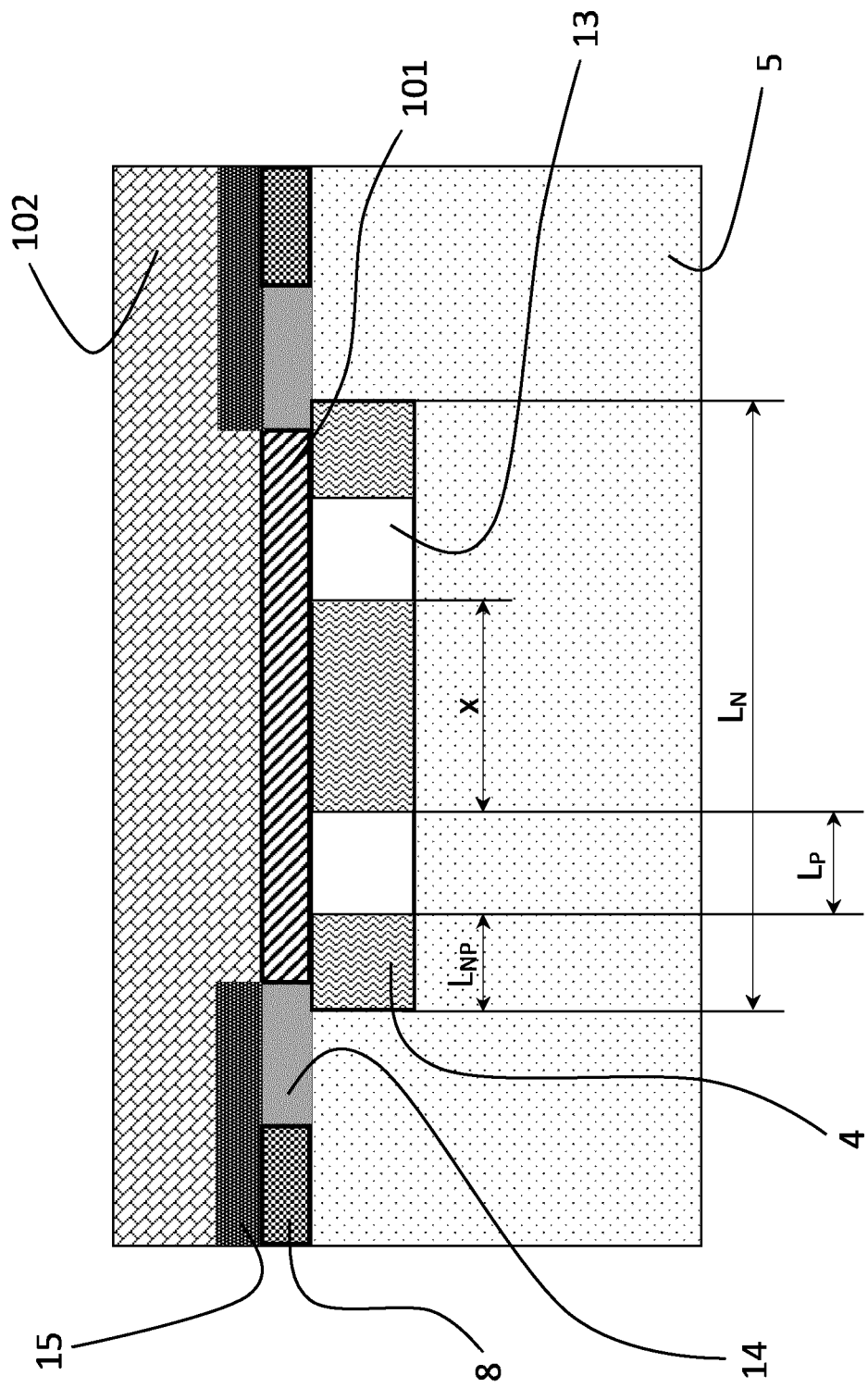
FIG. 3D shows an example of a cathode contact structure of a power semiconductor device according to an embodiment.

In another embodiment as shown e.g. in FIG. 3D, representing the thyristor with a flat cathode region (planar device), the cathode electrode 9 of the power semiconductor device according to an embodiment comprises first cathode metal layers 101 contacting the cathode regions 4 and second cathode metal layers 102 contacting the first cathode metal layers 101 of all of the cathode regions 4 of the plurality of thyristor cells.

In another embodiment, the second cathode metal 102 is a disk comprising molybdenum and which is not fixed permanently to the power semiconductor device, but is mechanically pressed by e.g. of a pole piece of a package of the power semiconductor device.

According to another embodiment, the power semiconductor device comprises gate-cathode insulations 14 laterally between the gate electrodes and the first cathode metal layers 101 on the first main side 2 of the wafer. The gate-cathode insulation 14 may be e.g. polyimide, oxide or any other insulator which has a higher thermal conductivity than air to improve the thermal performance of the device.

In another embodiment, the power semiconductor device furthermore comprises gate insulations 15 on the gate electrodes 8 and on the gate-cathode insulations 14. This option is advantageous for the case of the gate electrode placed at the periphery. This option is advantageous for the case of the gate electrode placed at the periphery.

According to another embodiment, the first cathode metal layers 101 form a substance-to-substance bond to the cathode regions 4 and the second cathode metal layers 102 form a removable connection to the first cathode metal layers 101 which second cathode metal layers (102) contact the first cathode metal layers 101 of all thyristor cells as one single common disk. The first cathode metal layers 101 may comprise aluminum and the second metal layers 102 may be formed by a molybdenum disk.

Figure 4:
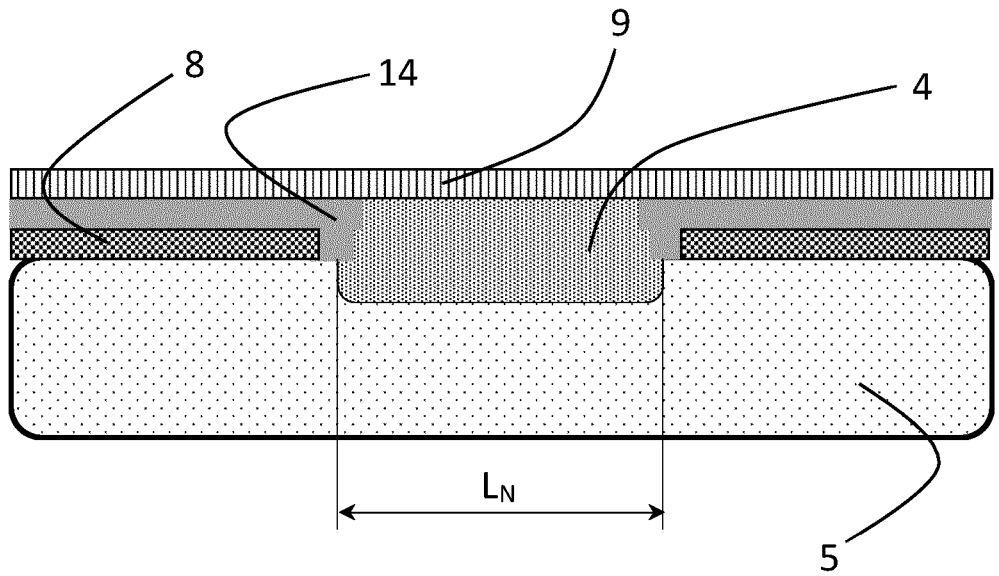
FIG. 4 discloses mesa cathode segments of a power semiconductor device according to an embodiment.
Figure 5:
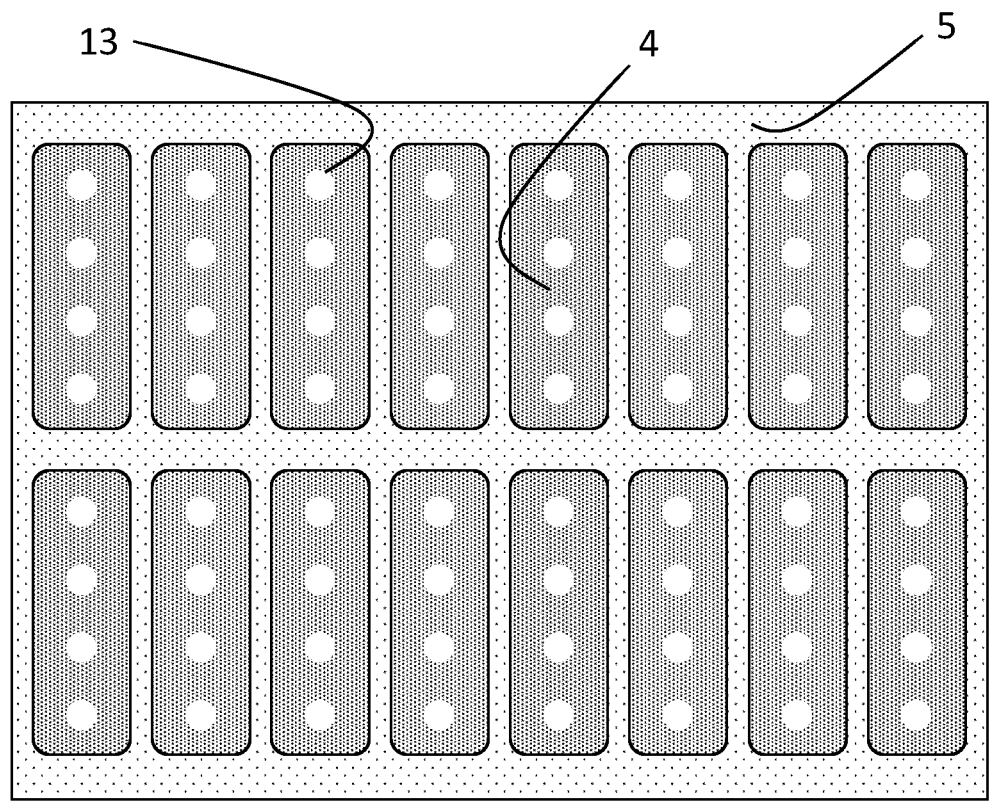
FIG. 5 shows a specific design of cathode regions and cathode short areas of a power semiconductor device according to an embodiment.

FIG. 4 discloses another embodiment, exemplarily a power semiconductor device wherein cathode regions 4 comprise top sections vertically extending above a top surface of the first base layer on the first main side 2 and bottom sections within the wafer. By the interdigitation of the gate and cathode by means of mesa cathode segments as shown in FIG. 4, the length of the gate-cathode boundary may be further maximized to achieve a high dI/dt and dV/dt. To optimize the electrical performance of the device and to lower the production costs, the size and shape of cathode segments may be adapted to achieve the desired effects.

According to another embodiment, the cathode region 4 is one of hexagonal shape, stripe shape or circular shape and an area of the top section is smaller than an area of the bottom section.

According to another embodiment, the cathode electrode 9 may comprise molybdenum. As already mentioned above, the cathode electrode 9 at least may be partially formed as molybdenum disk which is not permanently fixed to the power semiconductor device but is e.g. mechanically pressed by a pole piece of the package of the power semiconductor device.

According to another embodiment, the power semiconductor device comprises gate-cathode insulations 14 laterally between the gate electrodes 8 and the top sections of the cathode regions 4 and on top of the gate electrodes 8 and cathode electrodes 9 on top of the gate-cathode insulations 14 and the top sections of the cathode regions 4 contacting the top sections of the cathode regions 4. By the gate-cathode insulations 14 which are arranged laterally between the gate electrodes and the vertical extending cathode regions 4 and which are formed on top of the gate electrodes 8, a planar surface is formed as it is evident e.g. from FIG. 4, which therefore simplifies a subsequent packaging process and also avoids eventual reliability issues caused by small particles shorting the gate with cathode.

According to another embodiment, the cathode electrode 9 may comprise aluminum.

According to another embodiment and as disclosed e.g. in FIGS. 2A and 2B, the plurality of thyristor cells of the power semiconductor device according to an embodiment form a honeycomb gate design comprising multiple hexagons each comprising six struts.

According to another embodiment, the diameter of each of the hexagons is in a range of 1 mm to 20 mm or in a range of 2 mm to 10 mm.

It is also an object of embodiments to provide a method of manufacturing a Power semiconductor device according to embodiments. The method comprises a step of providing the wafer having a first main side 2, a step of generating cathode regions 4 within a cathode layer in the first base layer 5 by diffusing a dopant pre-deposited at the first main side 2 or implanting into the first main side 2, a step of generating cathode short areas 13 in the cathode layer by diffusing a dopant pre-deposited at the first main side or implanting into the first main side 2, a step of forming ohmic contacts of the gate electrodes 8 through a structured metal mask, a step of forming a gate-cathode insulations 14 through a structured mask layer, wherein this mask layer is etched on the cathode regions 4, a step of forming ohmic contacts of cathode electrodes 9 with the cathode regions 4.

LIST OF REFERENCE SIGNS 1 power semiconductor device
2 first main side
3 second main side
4 cathode region
5 first base layer
6 second base layer
7 anode layer
8 gate electrode
9 cathode electrode
10 anode electrode
11 central gate contact
12 peripheral gate contact
13 cathode short area
14 gate-cathode insulation
15 gate insulation
101 first cathode metal layer
102 second cathode metal layer

The invention claimed is:

1. A power semiconductor device comprising a semiconductor wafer having a first main side and a second main side opposite to the first main side (1), the semiconductor wafer comprising a plurality of parallel thyristor cells, wherein each thyristor cell comprises in an order from the first main side to the second main side:
  (a) a cathode electrode and a gate electrode arranged on the first main side;
  (b) a cathode layer comprising a cathode region of a first conductivity type, forming an ohmic contact with the cathode electrode;
  (c) a first base layer of a second conductivity type different from the first conductivity type, wherein the cathode region is formed as a well in the first base layer and forms a first p-n junction between the first base layer and the cathode region;
  (d) a second base layer of the first conductivity type forming a second p-n junction with the first base layer;
  (e) an anode layer of the second conductivity type separated from the first base layer by the second base layer;
  wherein the gate electrode forms an ohmic contact with the first base layer, and an anode electrode is arranged on the second main side and forms an ohmic contact with the anode layer;
  wherein the gate electrodes of the plurality of thyristor cells form a gate design comprising multiple polygons each comprising at least four struts,
  wherein the cathode regions are of hexagonal shape, and the cathode layers comprise cathode short areas of the second conductivity type connecting the cathode electrodes with the first base layers,
  wherein the cathode short areas are of polygonal shape or circular shape or stripe shape and the cathode short areas are placed along a hexagonal gate-cathode boundary within the hexagonal cathode region.

2. The power semiconductor device according to claim 1, wherein the multiple polygons are connected via a central gate contact.

3. The power semiconductor device according to claim 1, wherein the multiple polygons are connected via a peripheral gate contact.

4. The power semiconductor device according to claim 1, wherein a lateral width of the struts is in a range of 0.1 mm to 1 mm, or in a range of 0.1 mm to 0.5 mm.

5. The power semiconductor device according to claim 2, wherein a lateral width of the struts of the polygons decreases with growing distance from the central gate contactor the peripheral gate contact.

6. The power semiconductor device according to claim 1, wherein the power semiconductor device is a high-power reverse blocking thyristor or a reverse conducting thyristor.

7. The power semiconductor device according to claim 1, comprising first cathode metal layers contacting the cathode regions and second cathode metal layers contacting the first cathode metal layers of all of the cathode regions of the plurality of thyristor cells.

8. The power semiconductor device according to claim 7, comprising gate-cathode insulations laterally between the gate electrodes and the first cathode metal layers on the first main side of the wafer.

9. The power semiconductor device according to claim 8, comprising gate insulations on the gate electrodes and on the gate-cathode insulations.

10. The power semiconductor device according to claim 7, wherein the first cathode metal layers form a substance-to-substance bond to the cathode regions and the second cathode metal layers form a removable connection to the first cathode metal layers which second cathode metal layers contact the first cathode metal layers of all thyristor cells as one single common disk.

11. The power semiconductor device according to claim 1, wherein the cathode regions comprise top sections vertically extending above a top surface of the first base layer and bottom sections within the wafer.

12. The power semiconductor device according to claim 11, wherein an area of the top section is smaller than an area of the bottom section.

13. The power semiconductor device according to claim 11 comprising
  gate-cathode insulations laterally between the gate electrodes and the top sections of the cathode regions and on top of the gate electrodes and
  cathode electrodes on top of the gate-cathode insulations and the top sections of the cathode regions contacting the top sections of the cathode regions.

14. The power semiconductor device according to claim 1, wherein the plurality of thyristor cells form a honeycombed gate design comprising multiple hexagons each comprising six struts.

15. The power semiconductor device according to claim 14, wherein the diameter of each of the hexagons is in a range of 1 mm to 20 mm or in a range of 2 mm to 10 mm.

16. A method for manufacturing the power semiconductor device according to claim 1 comprising the following steps:

- a step of providing the wafer having a first main side;
- a step of generating cathode regions within a cathode layer in the first base layer by diffusing a dopant pre-deposited at the first main side or implanting into the first main side;
- a step of generating cathode short areas in the cathode layer by diffusing a dopant pre-deposited at the first main side or implanting into the first main side;
- a step of forming ohmic contacts of the gate electrodes through a structured metal mask;
- a step of forming gate-cathode insulations through a structured mask layer, wherein this mask layer is etched on the cathode regions;
- a step of forming ohmic contacts of the cathode electrodes with the cathode regions.

17. The power semiconductor device according to claim 3, wherein a lateral width of the struts of the polygons decreases with growing distance from the central gate contact or the peripheral gate contact.

18. The power semiconductor device according to claim 2, comprising first cathode metal layers contacting the cathode regions and second cathode metal layers contacting the first cathode metal layers of all of the cathode regions of the plurality of thyristor cells.

19. The power semiconductor device according to claim 3, comprising first cathode metal layers contacting the cathode regions and second cathode metal layers contacting the first cathode metal layers of all of the cathode regions of the plurality of thyristor cells.

20. The power semiconductor device according to claim 4, comprising first cathode metal layers contacting the cathode regions and second cathode metal layers contacting the first cathode metal layers of all of the cathode regions of the plurality of thyristor cells.

* * * * *